United States Patent
Equihua et al.

(10) Patent No.: US 9,178,506 B2
(45) Date of Patent: Nov. 3, 2015

(54) HIGH SPEED CHARGE CONTROL FOR POWER SWITCHING DEVICES

(71) Applicants: Edgar Equihua, Tijuana (MX); Sergio Orozco, Tijuana (MX)

(72) Inventors: Edgar Equihua, Tijuana (MX); Sergio Orozco, Tijuana (MX)

(73) Assignee: Crydom, Inc., Moorpark, CA (US)

( * ) Notice: Subject to any disclaimer, the term of this patent is extended or adjusted under 35 U.S.C. 154(b) by 23 days.

(21) Appl. No.: 13/623,694

(22) Filed: Sep. 20, 2012

(65) Prior Publication Data

US 2014/0077792 A1 Mar. 20, 2014

(51) Int. Cl.
*G05F 1/00* (2006.01)
*H03K 17/0412* (2006.01)
*G05F 1/56* (2006.01)
*G05F 1/575* (2006.01)

(52) U.S. Cl.
CPC ............ *H03K 17/04123* (2013.01); *G05F 1/56* (2013.01); *G05F 1/575* (2013.01); *Y10T 307/747* (2015.04)

(58) Field of Classification Search
CPC ........... G05F 1/56; G05F 1/565; G05F 1/575; H02M 3/155; H02M 3/156; H02M 3/158; H02M 3/1588; H02M 2001/0009; H02M 2001/0025; H02M 2001/0032; H02M 2001/0045
USPC .......... 323/289, 285, 288, 265–269, 273–277
See application file for complete search history.

(56) References Cited

U.S. PATENT DOCUMENTS

| | | | |
|---|---|---|---|
| 5,089,948 A * | 2/1992 | Brown et al. | 363/58 |
| 5,469,098 A | 11/1995 | Johnson, Jr. | |
| 6,094,087 A | 7/2000 | He et al. | |
| 6,144,193 A | 11/2000 | Illingworth | |
| 6,879,499 B2 * | 4/2005 | Matsumoto | 363/21.06 |
| 6,894,468 B1 * | 5/2005 | Bretz et al. | 323/274 |
| 7,339,804 B2 * | 3/2008 | Uchida | 363/56.1 |
| 7,994,827 B2 | 8/2011 | Williams | |
| 2011/0255311 A1 * | 10/2011 | Hsu et al. | 363/21.15 |
| 2012/0026759 A1 * | 2/2012 | Balakrishnan et al. | 363/21.15 |
| 2012/0163040 A1 * | 6/2012 | Zhang et al. | 363/21.12 |
| 2013/0241451 A1 * | 9/2013 | Wei et al. | 318/400.3 |
| 2013/0285491 A1 * | 10/2013 | Kuznetsov | 310/71 |
| 2013/0285635 A1 * | 10/2013 | Shimizu | 323/288 |

OTHER PUBLICATIONS

K.W. Lee et al. "Output Inductor-less Active Clamp Forward Converter Employing Current Boost-up Circuit for High Power Density Adaptor". IPEMC Conference 2009. May 17-20, 2009. pp. 797-803.*

(Continued)

*Primary Examiner* — Jessica Han
*Assistant Examiner* — Kevin H Sprenger
(74) *Attorney, Agent, or Firm* — Hunter Clark PLLC

(57) ABSTRACT

Disclosed are systems, devices, apparatus, circuits, methods, and other implementations, including a system that includes one or more power switching devices that receive power delivered by a power unit, and a high-speed charge control circuit electrically coupled to the one or more power switching devices. The high-speed charge control circuit includes an optocoupler coupled to the power unit and further coupled to a first switching device of the high-speed charge control circuit, the first switching device actuated based on output of the optocoupler to establish an electrical path to discharge at least a portion of electrical charge present at least on the one or more power switching devices when power delivery from the power unit is stopped.

17 Claims, 4 Drawing Sheets

(56) References Cited

OTHER PUBLICATIONS

MOSFET Based DC Solid State Relay, Celduc Relais, http://www.celduc-relais.com/all/pdfcelduc/scm0100200UK.pdf.

IGBT Based DC Solid-State Relay, Celduc Relais, http://www.celduc-relais.com/all/pdfcelduc/SCI0100600UK.pdf.

HDD-E Family of Solid State Relays, Power-IO, 2011, http://www.power-io.com/library/databulletin/hdd-e-family.pdf.

* cited by examiner

HIGH SPEED CHARGE CONTROL FOR POWER SWITCHING DEVICES

BACKGROUND

Power applications often require the use of power switching devices such as power transistors (e.g., power MOSFET, Insulated-Gate Bi-Polar Transistor (IGBT)). Efficiency of these power switching devices is affected, to some extent, by how quickly these devices can begin operation upon commencement of power delivery.

SUMMARY

In some variations, a system is disclosed. The system includes one or more power switching devices that receive power delivered by a power unit, and a high-speed charge control circuit electrically coupled to the one or more power switching devices. The high-speed charge control circuit includes an optocoupler coupled to the power unit and further coupled to a first switching device of the high-speed charge control circuit, the first switching device actuated based on output of the optocoupler to establish an electrical path to discharge at least a portion of electrical charge present at least on the one or more power switching devices when power delivery from the power unit is stopped.

Embodiments of the system may include at least some of the features described in the present disclosure, including one or more of the following features.

The high-speed charge control circuit may further include a charging circuit to provide an initial electrical charge to the one or more power switching devices when power delivery from the power unit is commenced.

The charging circuit may include a second switching device actuated to an ON state when the power is delivered from the power unit, and a capacitor coupled to a terminal of the second switching device such that the initial electrical charge on the capacitor is delivered to the one or more power switching devices when the second switching device is actuated to the ON state.

The system may further include a transformer including input terminals coupled to the power unit and output terminals coupled to the one or more power switching devices, the transformer configured to electrically isolate the one or more power switching devices from the power unit.

The optocoupler may include a LED device to emit optical radiation when powered by the power unit, and at least one photo-sensitive device to generate electrical current when irradiated by at least a portion of the optical radiation emitted by the LED device. The optocoupler may further be configured to electrically isolate the one or more power switching devices from the power unit.

The first switching device may include a JFET transistor actuated based on the output of the optocoupler such that the JFET transistor is in an OFF state when the electrical current generated by the optocoupler is applied to a gate of the JFET transistor.

The one or more power switching devices may include one or more of, for example, a MOSFET transistor, and/or an Insulated-Gate Bi-Polar Transistor (IGBT).

The system may further include the power unit.

The power unit may include a current boost circuit configured to deliver an initial high current surge to inputs of a transformer to cause a charge boost, delivered from the outputs of the transformer, to be provided to the one or more one or more power switching devices when power delivery from the power unit is commenced.

The current boost circuit may include at least one capacitor coupled to one of the inputs of the transformer.

The power unit may include a hysteresis comparator to produce an output to actuate another switching device configured to control power delivery to at least the optocoupler and/or an oscillator driver.

In some variations, a method is disclosed. The method includes delivering power produced by a power unit to one or more power switching devices, and actuating a first switching device based on output of an optocoupler to establish an electrical path to discharge at least a portion of electrical charge present at least on the one or more power switching devices when power delivery from the power unit is stopped, the optocoupler including one or more input terminals electrically coupled to the power unit.

Embodiments of the method may include at least some of the features described in the present disclosure, including at least some of the features described above in relation to the system, as well as one or more of the following features.

The method may further include providing an initial electrical charge to the one or more power switching devices when power delivery from the power unit is commenced.

Providing the initial charge may include delivering the initial charge from a capacitor coupled to a terminal of a second switching device such that the initial electrical charge on the capacitor is delivered to the one or more power switching devices when the second switching device is actuated to the ON state.

In some variations, a circuit is disclosed. The circuit includes one or more power switching devices that receive power delivered by a power unit, and a high-speed charge control circuit electrically coupled to the one or more power switching devices. The high-speed charge control circuit includes an optocoupler coupled to the power unit and further coupled to a first switching device of the high-speed charge control circuit, the first switching device actuated based on output of the optocoupler to establish an electrical path to discharge at least a portion of electrical charge present at least on the one or more power switching devices when power delivery from the power unit is stopped.

Embodiments of the circuit may include at least some of the features described in the present disclosure, including at least some of the features described above in relation to the system and the method.

The embodiments described herein enable reduction of turn-off dV/dt losses and of dynamic switching losses. The embodiments described herein also enable high frequency operation of power switches, such as power MOSFET devices and/or IGBT devices.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, is meant to encompass variations of ±20% or ÷10%, ÷5%, or +0.1% from the specified value, as such variations are appropriate to in the context of the systems, devices, circuits, methods, and other implementations described herein. "Substantially" as used herein when referring to a measurable value such as an amount, a temporal duration, a physical attribute (such as frequency), and the like, is also meant to encompass variations of ±20% or ±10%, ±5%, or +0.1% from the specified value, as such variations are appropriate to in the context of the systems, devices, circuits, methods, and other implementations described herein.

As used herein, including in the claims, "or" and "and" as used in a list of items prefaced by "at least one of" or "one or more of" indicates that any combination of the listed items may be used. For example, a list of "at least one of A, B, or C" includes any of the combinations A or B or C or AB or AC or BC and/or ABC (i.e., A and B and C). Furthermore, to the extent more than one occurrence or use of the items A, B, or C is possible, multiple uses of A, B, and/or C may form part of the contemplated combinations. For example, a list of "at least one of A, B, or C" may also include AA, AAB, AAA, BB, etc.

Unless defined otherwise, all technical and scientific terms used herein have the same meaning as commonly understood by one of ordinary skill in the art to which this disclosure belongs.

Details of one or more implementations are set forth in the accompanying drawings and in the description below. Further features, aspects, and advantages will become apparent from the description, the drawings, and the claims.

BRIEF DESCRIPTION OF THE DRAWINGS

Like reference symbols in the various drawings indicate like elements.

DETAILED DESCRIPTION

Disclosed herein are systems, devices circuits, methods, and other implementations, including a system that includes one or more power switching devices that receive power delivered by a power unit, and a high-speed charge control circuit electrically coupled to the one or more power switching devices. The high-speed charge control circuit includes an optocoupler coupled to the power unit and further coupled to a first switching device of the high-speed charge control circuit. The first switching device is actuated based on output of the optocoupler to establish an electrical path to discharge at least a portion of electrical charge present at least on the one or more power switching devices when power delivery from the power unit is stopped. In some embodiments, the high-speed charge control circuit also includes a charging circuit (e.g., implemented using a capacitor coupled to a second switching device) to provide an initial electrical charge to the one or more power switching devices when power delivery from the power unit is commenced. In some variations, the implementations described herein may be used to perform high-speed charge control operations for other types of devices, systems, components, etc.

Figure 1:
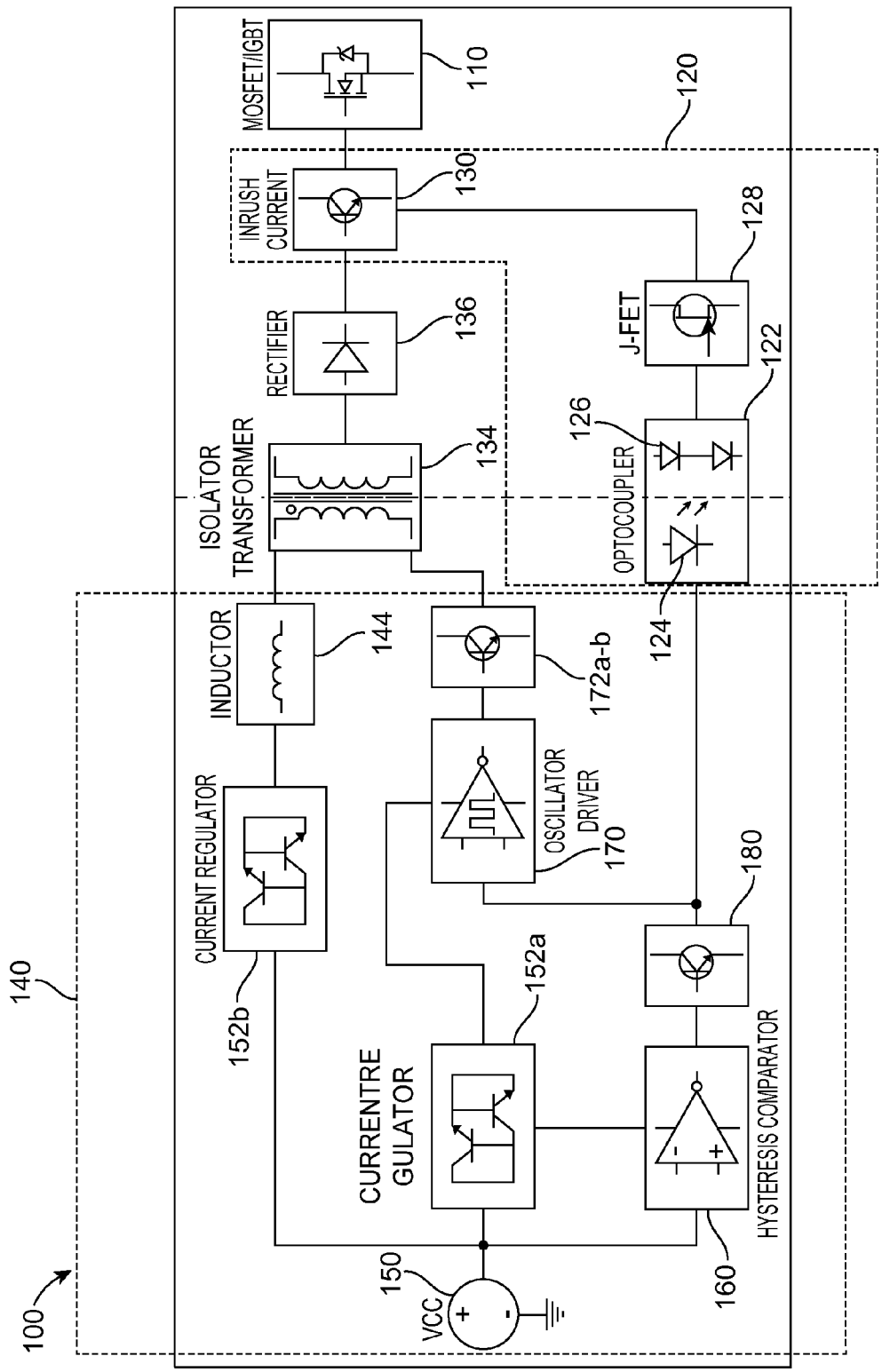
FIG. 1 is a diagram of an example system to enable high-speed charge control of power switching devices.
Figure 2A:
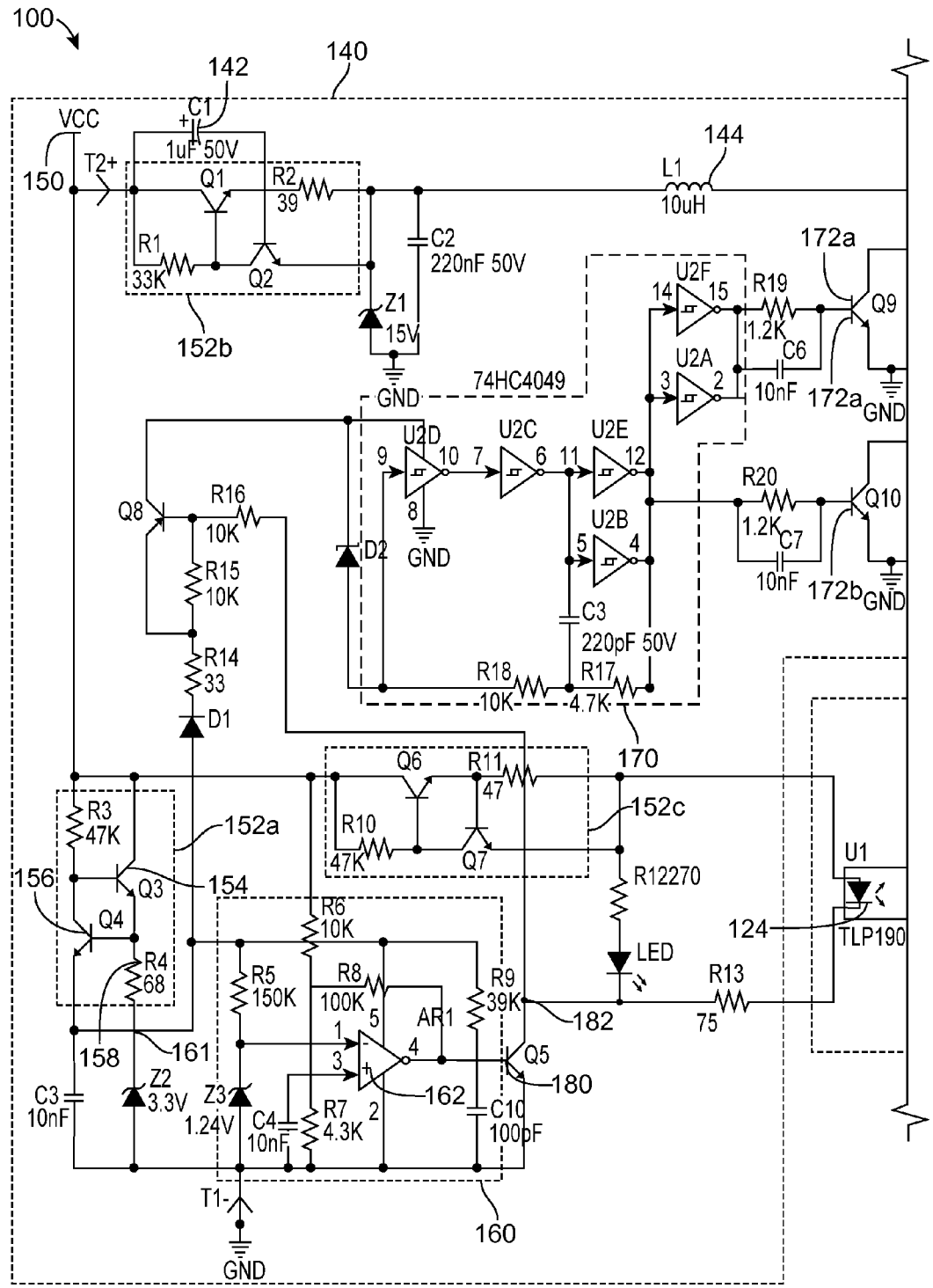
FIG. 2A and FIG. 2B are diagrams of partial views of an example system to enable high-speed charge control of power switching devices.
Figure 2B:
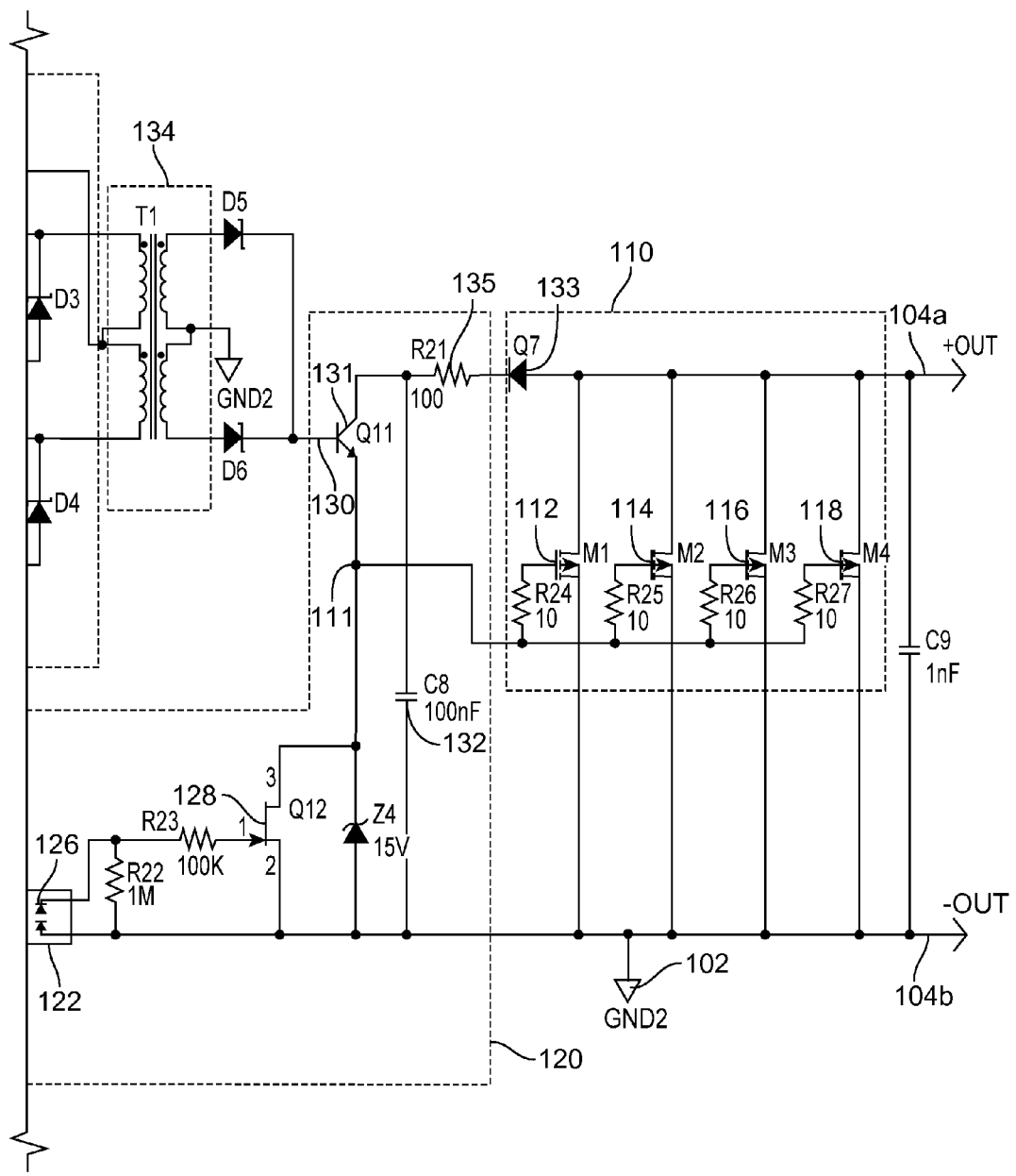

Thus, with reference to FIG. 1, a circuit diagram of an example embodiment of a system 100 configured to enable high-speed charge control (e.g., charging and discharging) of power switching devices is shown. The system 100 includes a switching device section 110 that comprises one or more power switching devices 112-118 (more particularly shown in FIGS. 2A and 2B, illustrating an example system provided as two separate partial view diagrams), similar to the system 100 of FIG. 1, to enable high-speed charge control) that are configured to receive power delivered by a power unit 140. The one or more power switching devices 112-118 may include such switches as, for example, power MOSFET devices, Insulated-Gate Bi-Polar Transistors (IGBT) devices, etc. Electrically coupled to the one or more power switching devices is high speed charge control circuit 120 configured to control/facilitate, at least in part, charging and discharging operations for the one or more power switching devices 112-118. For example, to enable the one or more power switching device to become quickly operational upon commencement of power delivery (e.g., from a power source coupled to the power unit 140), the charge control circuit 120 enables a quick delivery of charge (as will be described in greater details below) to the power switching devices, to thus overcome small delays in powering/charging the power switching devices that would occur if there was no charge contribution other than that provided by the power unit. Additionally, the charge control circuit is also configured to enable quick discharge of at least a portion of electrical charge stored (e.g., as a result of inherent capacitance associated with various circuit components) on, for example, the power switching devices, the charge control circuit 120, and/or other modules/components that are electrically coupled to the power switching devices and the charge control circuit.

As further shown in FIG. 1, the charge control circuit 120 includes an optocoupler 122 coupled, at its inputs, to the power unit 140, and further coupled to a first switching device 128 of the charge control circuit 120. The first switching device 128, which, in some embodiments, may include a JFET transistor, is actuated based on output of the optocoupler 122. The optocoupler 122 is configured to cause an electrical path to be established by the first switching device to discharge electrical charge present on, for example, the one or more power switching devices when power delivery from the power unit is stopped. The optocoupler 122 is structured to electrically isolate its output side (and the load coupled thereto) from electrical currents applied to the input side of the optocoupler 122, or from electrical currents that are otherwise present in the circuit coupled to the optocoupler's input side. As also shown in FIGS. 2A-B, the optocoupler 122 includes, in some implementations, a LED (light emitting diode) device 124 to emit optical radiation when powered by electrical power (delivered by the power unit 140 in the example embodiments of FIGS. 1 and 2A-B), and at least one photo-sensitive device 126 to generate electrical current when irradiated by at least a portion of the optical radiation emitted by the LED device. The optical radiation emitted by the LED may include, for example, infrared radiation, visible light radiation, and other optical radiation in other bands that can excite photosensitive devices to generate current in response to the application of radiation to them. The at least one photosensitive device 126 may include one or more of, for example, a solar cell, a photoresistor, a photodiode, a phototransistor, a silicon-controlled rectifier (SCR), a triac, etc. Because the current produced by the at least one photosensitive device 126 results from optical interaction between the input stage of the optocoupler (namely, the LED) and the output stage (namely, the photo-sensitive device) rather than in direct response to current applied to the input stage of the optocoupler, the optocoupler, therefore, provides the electrical isolation between the input and output sides of the optocouplers.

As noted, the output of the optocoupler, namely, at least one terminal of the at least one photosensitive device 126, is coupled to the first switching device 128, which, as noted, may be a JFET transistor. The JFET transistor is actuated based on the output of the optocoupler such that the JFET transistor 128 is in an OFF state (e.g., its cutoff region) when electrical current generated by the optocoupler is applied to a gate of the JFET transistor. Thus, when the power unit is on and is delivering power, it will deliver current to the input of the optocoupler, resulting in the LED becoming active and emitting radiation. Some of the emitted radiation will be applied to the at least one photosensitve device 126, and as a result current will be generated by the at least one photosensitive device. The generated current will be delivered to the gate of the JFET transistor 128, to cause the gate to be in its OFF state (e.g., its cut-off region), and therefore causing the JFET to be non-conducting. As shown in FIG. 2B, terminal 3 (e.g., the drain terminal) of the JFET transistor 128 is electrically coupled to the terminals of the one or more power switching devices 112-118. Therefore, when the JFET transistor is actuated by current generated by the at least one photo-sensitive device 126, there will be no electrical path between the terminals of the power switching devices and a ground 102 of the system 100.

When power delivery from the power unit is stopped, the LED 124 will be turned off and the emission of optical radiation will cease. As a result, there will be no current generation by the at least one photo-sensitive device 126 of the optocoupler 122, and thus no current to actuate the JFET transistor 128 at its gate. Accordingly, the JFET transistor 128 will be switched to its ON (conductive) state (e.g., in its saturation region), thus establishing an electric path between the terminals of the power switching devices and the ground 102. This will cause at least a portion of charge stored or accumulated on the power switching device to quickly flow to the ground 102. The configuration including the optocoupler 122 and the JFET 128 therefore enables a quick discharge of charge on the power switching device upon stoppage of power delivery by the power unit.

As noted, the charge control circuit 120 is also configured to enable quick charging of the one or more power switching devices 112-118 upon the power unit 140 commencing power delivery (i.e., when a power source 150, marked as $V_{cc}$, is turned on). As shown in FIGS. 2A-B, the charge control circuit includes a second switching device 130 (also illustrated in FIG. 1), which in some embodiments may include a BJT transistor (marked Q11 in FIG. 2B) that is configured to be actuated to an ON state when actuated by application of current to its base terminal. Coupled to another terminal 131 of the second switching device 130 (e.g., to the transistor's collector) is a capacitor 132. In operation, when power delivery by the power unit 140 commences, a transformer 134, whose output stage is electrically coupled to the base of the second switching device 130 (optionally via a Schottky diode), becomes energized and current begins to flow via the transformer's output stage, causing the switching device 130 to be actuated and to be switched to its ON (conductive) state. When the switching device 130 becomes conductive, an electrical path is established, via the now conductive switching device 130, between the capacitor 132 and the one or more power switching devices (as noted, when power is delivered by the power unit, there will be an open circuit between the point 111 and the ground 102). As a result, charge stored on the capacitor 132 will therefore be delivered via the established electric path to contribute to the fast charging of the one or more power switching devices. The established electrical path through the switching device 130 will also provide current from the output stage of the transformer 134 (flowing through the base of the switching device 130).

In some implementations, the charge delivered by the capacitor 132 when the electrical path through the switching device 130 is established may be electrical charge that was stored when the power unit 140 was inactive (i.e., when the power unit 140 was not delivering power). The capacitor 132 may be charged by another external voltage source (not shown) that may be connected, for example, to the terminals 104a and 104b (also marked +Out and −Out, respectively). Such an external voltage source may be connected to the output terminals 104a and 104b when the power unit 140 becomes inactive. During the time that the power unit 140 is inactive, a diode 133 will allow current flow in only one direction from the terminals 104a and b, thus enabling the capacitor 132 to accumulate electrical charge. When the power unit 140 becomes active, and the electrical path through the switching device 130 is established, the diode will block current flow to the output terminals and/or to the drain of the switching devices section 110. Thus, electrical charge stored on the capacitor 132 will be delivered to the gates of the switching devices. As noted, when the power unit 140 is off, the switching device 130 will also be off, thus preventing or inhibiting discharging of the capacitor 132 through the switching device 130 when the power unit 140 is off. A current limiting resistor 135 (also marked as resistor R21 in FIG. 2B) prevents or inhibits any overflow current when the capacitor 132 is charging.

In some implementations, the transformer 134 may be a quad channel digital isolator transformer with a center tap, coupled to a full wave rectifier (such as the rectifier 136 illustrated in FIG. 1). The transformer 134 and the optocoupler 122 provide, in some implementations, 2.5 kV input-output electric isolation. In some implementations, the transformer 134 may include a quad-channel digital isolation transformer, with an inductance of, for example, approximately 63.75 uh, and a turn ratio of, for example, 1:5. In some embodiments, an input voltage of, for example, approximately 5 v may be provided to the transformer 134, and the transformer's output voltage may be, for example, in a range between approximately −12 to 15 v.

Additional charging current initially delivered to the one or more power switching devices 112-118 (e.g., during the period when switching and other operations delays of the system 100 can limit or slow the charging of the power switching devices may be realized by a current boost circuit coupled to the input stage of the transformed 134. The current boost circuit is configured to deliver an initial high current surge to inputs of the transformer to cause a charge boost, delivered from the outputs of the transformer 134, to the one or more power switching devices 112-118 when power delivery from the power unit is commenced. In some implementations, the current boost circuit includes at least one capacitor 142 coupled (in some configuration via at least one inductor 144) to one of the inputs of the transformer. When the power source ($V_{cc}$) is turned on, in the immediate period following the activation of the power unit, a current surge will be delivered to the transformer 134, and thus to the power switching devices. The duration of this period for delivering the current boost is based in part on the capacitance value of the at least one capacitor 142. Thus, when the power source is turned on, a current surge will be delivered to the transformer, with the duration of this surge period determined according to the factor $\tau = RC$ (i.e., the RC time constant). Once steady-state operation is reached, the at least one inductor 144 coupled to the capacitor 142 may provide extra energy to the transformer when the transformer is oscillating at a high frequency (e.g., 350 kHz+/−20%).

With continued reference to FIG. 1, as shown, the power unit 140 includes the power source 150, identified as $V_{cc}$, which itself may be powered by an external source (e.g., electrical outlet delivering standard voltage of, for example, 90-140 $V_{ac}$, a battery delivering, for example, 4.5 to 32 $V_{dc}$, etc.) In some embodiments, the power source has a voltage of 4.5-32.0V (although higher or lower voltage values may also be used), and provides power to the various units/sections of the system 100 depicted in FIGS. 1 and 2. In some embodiments, power to some of the units/sections of the system 100 may be provided from the power source 150 via one or more current regulators that limit the maximum power that may be provided to those units/sections, thus providing these units/sections with current protection. In the example implementations described herein, three (3) current regulators (152a, 152b, and 152c) are provided (the regulators 152a and 152b are illustrated in both FIGS. 1 and 2, while the regulator 152c is illustrated only in FIG. 2). In some embodiments, the current regulators may be implemented using a two transistor configuration. For example, as shown with respect to the current regulator 152a, which implements current regulation for a comparator 160 and for an oscillator driver 170, the regulator includes a first BPJ transistor 154 whose emitter terminal is electrically coupled to the base terminal of a second BJP transistor 156. A resistor 158 (marked R4 in FIG. 2) and the emitter of the second transistor 156 are electrically coupled to an input of the sections/units whose current is being regulated (e.g., the resistor 158 and the emitter of the second transistor 156 are coupled to the comparator circuit at a point 161). The maximum current that may be outputted by a 2-transistor current regulator, such as the current regulator 152a, is determined according to the relationship:

$$I_{max} = V_{BE(second\ transistor)}/R$$

where $V_{BE\ (second\ transistor)}$ is the base-emitter voltage of the second transistor (e.g., the transistor 156 of the current regulator 152a), and R is the value of the resistor (e.g., the resistor 158) coupled to the emitter of the first transistor (transistor 154). In implementations depicted in FIG. 2, the first BPJ transistor 154 of the regulator 152a is configured to perform transistor regulator functionality, while the second BPJ transistor 156, along with the resistor 158, are configured to perform current limiting functionality. When the current exceeds a predetermined maximum current ($I_{max}$), the second BPJ transistor 156 starts to conduct in order to decrease the base current of the first BPJ transistor 154, compensating and maintaining a constant current, thus preventing or inhibiting increase in the output current. The two other regulators, 152b and 152c, regulate the current provided to the transformer 134 and to the optocoupler 122, and may be configured to provide maximum currents of, for example, approximately 15 mA to the transformer 134, and approximately 12 mA to the optocoupler 122.

The comparator 160, whose current is regulated by the regulator 152a, is configured to control the operation of the optocoupler 122 and a oscillator driver 170 such that in response to a determination that a voltage level applied at the comparator 160 has dropped below a predetermined voltage level, current/power to the optocoupler 122 and to the oscillator driver 170 will be terminated. The comparator 160 may be, in some embodiments, a hysteresis comparator implemented to generate an output control signal (to actuate a switching device, such as a transistor 180 depicted in FIGS. 1 and 2A) when the voltage applied at the hysteresis comparator exceeds a first pre-determined level, and to terminate the output control signal when the voltage level at the hysteresis comparator is below another, different, pre-determined level. Implementation of hysteresis behavior in the comparator provides a pre-defined range of permissible voltage fluctuation from the first pre-determined voltage level that caused a switch of the comparator to its ON state, such that the comparator is not switched to its OFF state due to small deviations (e.g., noise-based deviations) from that first pre-determined voltage level. In the embodiments of FIGS. 1 and 2A-B, the comparator 160 may be implemented using an operational amplifier (op-amp) 162. The comparator's first and second predetermined threshold voltages may be controlled based on a reference voltage applied at the negative terminal of the op-amp 162 and the values of resistors coupled to the positive terminal of the op-amp 162. For example, the Rise threshold ($V_{THR}$), corresponding to the first pre-determined voltage at which the op-amp will generate a logical 1 signal at its output, may be determined according to the relationship:

$$V_{THR} = V_{REF} \times R_6\left(\left(\frac{1}{R_6}\right) + \left(\frac{1}{R_7}\right) + \left(\frac{1}{R_8}\right)\right)$$

where $R_6$, $R_7$, and $R_8$ are the resistors coupled to the positive terminal of the op-amp 162 as illustrated in the diagram of FIG. 2 FIG. 2A. The Fall threshold ($V_{THF}$), corresponding to the second pre-determined voltage at which the op-amp will switch from a logical 1 output to a logical 0 output, may be determined according to the relationship:

$$V_{THF} = V_{REF} \times R_6\left(\left(\frac{1}{R_6}\right) + \left(\frac{1}{R_7}\right) + \left(\frac{1}{R_8}\right)\right) - \left(\frac{R_6}{R_8 + R_9}\right) \times V_{cc}$$

In the example embodiments of FIGS. 1 and 2A-B, the reference voltage, $V_{REF}$, is set to approximately 1.24 V, the Rise threshold ($V_{THR}$) is set to approximately 4.3 V, and the Fall threshold, $V_{THF}$, is set to approximately 4.1 V. Other value $V_{THR}$ and/or $V_{THF}$ may be used.

Accordingly, when the voltage at the positive terminal of the op-amp 162 exceeds the first (i.e., Rise) pre-determined threshold, the output of the op-amp 162 will be switched to a logical high (1), and when the voltage at the positive terminal of the op-amp falls below the second (Fall) pre-determined threshold, the output of the op-amp 162 will be switched to a logical low (0). The output of the op-amp 162 actuates switching device 180. Particularly, in the example embodiments of FIGS. 1 and 2A-B, the output of the op-amp 162 is coupled to the base of the BJT transistor 180 to thus switch the transistor 180 to its ON (logical high) state, in which the transistor will be in its conducting state, when the output of the op-amp 162 is a logical high. When the output of the op-amp 162 is a logical low, the transistor will be switched to its OFF state and will not be conducting. When the transistor 180 is in its ON state, and therefore, conducting, an electrical path will be established between the point 182 (which is coupled to, among other points, the LED 124 of the optocoupler 122), to enable operation of the optocoupler 122 and of the oscillator driver 170.

The oscillator driver 170, whose activation is also controlled through actuation of the switching device 180, is configured to generate an oscillating signal that is used to actuate one or more switching devices (172a and 172b in the example implementations of FIGS. 1 and 2A-B) that is coupled to the transformer 134. Thus, the oscillator driver turns the switching devices 172a and 172b on or off at an adjustable frequency that may be controlled by pre-selecting various settings for the oscillator driver, or by periodically changing those settings through, for example, change of values of control components (e.g., resistor values), through a user interface (not shown), etc. In some embodiments, the oscillator driver may be implemented using an IC CMOS Hex Inverter (part number 74HC4049D), or other types of hex inverters. When the switching devices 172a and b (which may be implemented using BJT transistors, some other transistor type, or through other switching technology, such as electromechanical switching technology) are in their ON state the transformer 134 is active (i.e., it receives current via, for example, the current regulator 152b) and can induce a voltage at the output stage of the transformer 134. When the switching devices are in their OFF state the transformer 134 is inactive. By oscillating the ON-OFF states of the switching devices, the current provided to the transformer 134 can also be oscillated, thus providing the transformer with a periodic current that energizes the transformer and enables current to be generated at the output stage of the transformer 134 that is then provided to the one or more power switching devices 112-118. In some implementations, the oscillator driver is configured to drive the switching devices 172a and 172b, and thus to drive the transformer 134, at a frequency of 350 kHz. Other driving frequencies may also be implemented and used.

Figure 3:
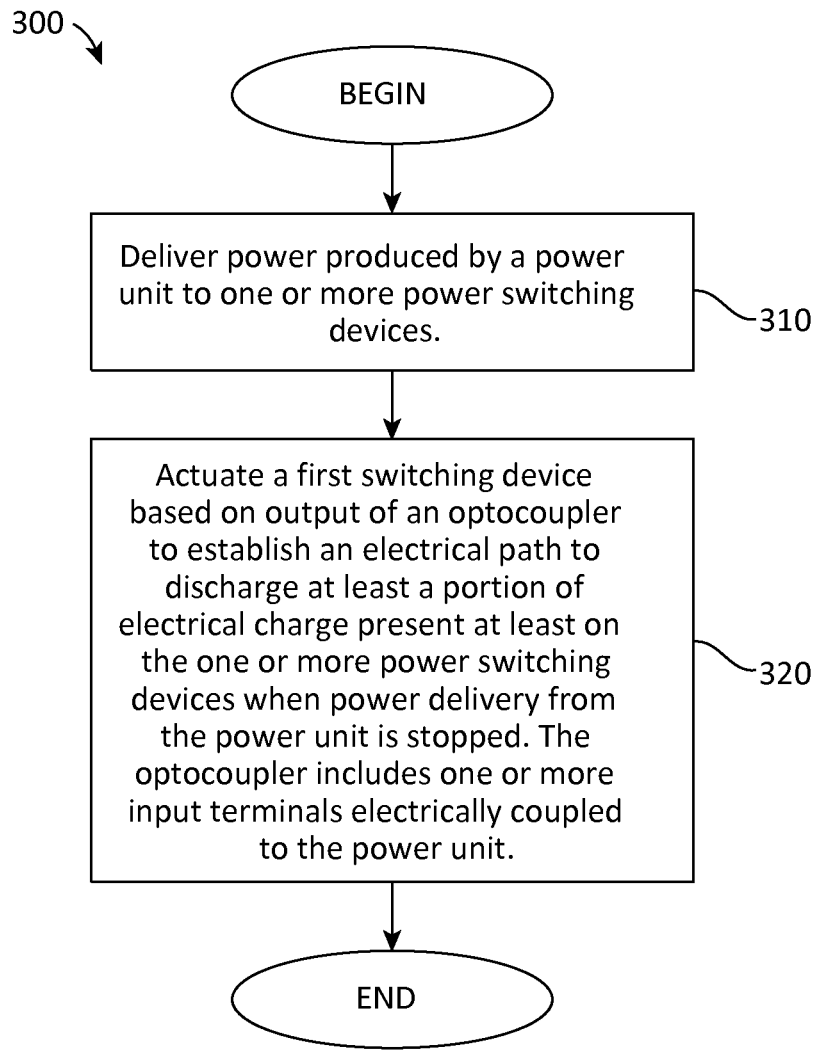
FIG. 3 is a flowchart of an example procedure for charge control of one or more power switching devices.

With reference now to FIG. 3, a flowchart of an example procedure 300 for charge control of one or more power switching devices is shown. The procedure 300 includes delivering 310 power to one or more power switching devices (e.g., power MOSFET devices, power IGBT devices, etc.) from a power unit. A first switching device, implemented, for example, using a JFET device, is actuated 320 based on output of an optocoupler (such as the optocoupler 122 shown in FIGS. 1 and 2A-B) to establish an electrical path to discharge at least a portion of electrical charge present at least on the one or more power switching devices when power delivery from the power unit is stopped. As noted, the optocoupler includes one or more input terminals electrically coupled to the power unit. The optocoupler electrically isolates the one or more power switching devices from the power unit (and by extension, from the power source, such as the source 150 shown in FIGS. 1 and 2A). Operation of the optocoupler may also be controlled, in some implementations, by a comparator, such as the hysteresis comparator 160 of FIGS. 1 and 2A, whose output actuates another switching device that opens or closes (in accordance with the actuating output of the comparator) the electrical path through which current flows to and from the LED device of the optocoupler. In some embodiments, power to the one or more power switching device is provided via a transformer, such as the transformer 134, which also provides electrical isolation for the one or more switching devices.

As further noted, to facilitate quick charging of the one or more switching devices, in some embodiments, performing the charge control procedure also may include providing an initial electrical charge to the one or more power switching devices when power delivery from the power unit is commenced. Providing the initial electrical charge may be performed, for example, by a charging circuit that includes a second switching device (e.g., the switching device 130 of FIGS. 1 and 2) that is actuated to an ON state when the power is delivered from the power unit, and a capacitor (such as the capacitor 132 of FIGS. 1 and 2) coupled to a terminal of the second switching device such that an initial electrical charge on the capacitor is delivered to the one or more power switching devices when the second switching device is actuated to the ON state.

In some variations, a processor-based device(s) may be used to facilitate the implementation of at least part of the system 100, and/or implementation of at least some of the procedures, processes, and/or operations described herein. Such a processor-based device(s) may be coupled to a storage device that may include a computer program product that when executed on the processor-based device(s) causes the processor-based device to perform operations to facilitate the implementation of the above-described procedures/processes/operations. Alternatively and/or additionally, in some embodiments, special purpose logic circuitry, e.g., an FPGA (field programmable gate array), a DSP processor, or an ASIC (application-specific integrated circuit) may be used in the implementation of at least part of the system 100 and/or of the operations and procedures described herein.

Although particular embodiments have been disclosed herein in detail, this has been done by way of example for purposes of illustration only, and is not intended to be limiting with respect to the scope of the appended claims, which follow. In particular, it is contemplated that various substitutions, alterations, and modifications may be made without departing from the spirit and scope of the invention as defined by the claims. Other aspects, advantages, and modifications are considered to be within the scope of the following claims. The claims presented are representative of the embodiments and features disclosed herein. Other unclaimed embodiments and features are also contemplated. Accordingly, other embodiments are within the scope of the following claims.

What is claimed is:

1. A system comprising:
   one or more power switching semiconductor devices that receive power delivered by a power unit; and
   a high-speed charge control circuit electrically coupled to the one or more power switching semiconductor devices, the high-speed charge control circuit comprising:
      an optocoupler to electrically isolate the power unit from the one or more power switching semiconductor devices, the optocoupler coupled to the power unit and further coupled to a first switching device of the high-speed charge control circuit, the first switching device actuated to a conductive state based on output of the optocoupler to establish an electrical path, passing through the first switching device, between at least some terminals of the one or more power switching semiconductor devices and ground to discharge at least a portion of electrical charge present at least on the one or more power switching semiconductor devices through the first switching device actuated to the conductive state by the optocoupler and to the ground when power delivery from the power unit for powering the one or more power switching semiconductor devices is stopped, wherein when the power for powering the one or more power switching semiconductor devices is being delivered from the power unit, the first switching device coupled to the optocoupler is actuated to a non-conductive state such that the electrical path between the at least some terminals of the one or more switching devices and the ground is removed; and
      a charging circuit to provide an initial electrical charge to the one or more power switching semiconductor devices when the power delivery from the power unit is commenced, the charging circuit comprising:
         a second switching device actuated to an ON state in response to the power for powering the one or more power switching semiconductor devices being delivered from the power unit; and
         a capacitor coupled to a terminal of the second switching device with the initial electrical charge, previously stored on the capacitor while the power unit was not delivering power to the one or more power switching semiconductor devices, delivered to the one or more power switching semiconductor devices through the second switching device when the second switching device is actuated to the ON state in response to commencing of the power delivery for powering the one or more power switching semiconductor devices.

2. The system of claim 1, further comprising:
a transformer including input terminals coupled to the power unit and output terminals coupled to the one or more power switching semiconductor devices, the transformer configured to electrically isolate the one or more power switching semiconductor devices from the power unit.

3. The system of claim 1, wherein the optocoupler comprises:
a LED device to emit optical radiation when powered by the power unit; and
at least one photo-sensitive device to generate electrical current when irradiated by at least a portion of the optical radiation emitted by the LED device.

4. The system of claim 3, wherein the first switching device comprises a JFET transistor actuated based on the output of the optocoupler such that the JFET transistor is in an OFF state when the electrical current generated by the optocoupler is applied to a gate of the JFET transistor.

5. The system of claim 1, wherein the one or more power switching semiconductor devices comprise one or more of: a MOSFET transistor, or an Insulated-Gate Bi-Polar Transistor (IGBT).

6. The system of claim 1, further comprising:
the power unit.

7. The system of claim 6, wherein the power unit comprises:
a current boost circuit configured to deliver an initial high current surge to inputs of a transformer to cause a charge boost, delivered from the outputs of the transformer, to be provided to the one or more one or more power switching semiconductor devices when power delivery from the power unit is commenced.

8. The system of claim 7, wherein the current boost circuit comprises:
at least one capacitor coupled to one of the inputs of the transformer.

9. The system of claim 6, wherein the power unit comprises:
a hysteresis comparator to produce an output to actuate another switching device configured to control power delivery to at least the optocoupler.

10. A method comprising:
delivering power produced by a power unit to one or more power switching semiconductor devices;
actuating a first switching device to a conductive state based on output of an optocoupler to establish an electrical path, passing through the first switching device, between at least some terminals of the one or more power switching semiconductor devices and ground to discharge at least a portion of electrical charge present at least on the one or more power switching semiconductor devices through the first switching device actuated to the conductive state by the optocoupler and to the ground when power delivery from the power unit for powering the one or more power switching semiconductor devices is stopped, with the optocoupler configured to electrically isolate the power unit from the one or more power switching semiconductor devices, the optocoupler including one or more input terminals electrically coupled to the power unit, wherein when the power for powering the one or more power switching semiconductor devices is being delivered from the power unit, the first switching device coupled to the optocoupler is actuated to a non-conductive state such that the electrical path between the at least some terminals of the one or more switching devices and the ground is removed; and
providing an initial electrical charge to the one or more power switching semiconductor devices when the power delivery from the power unit is commenced, wherein providing the initial charge comprises:
delivering the initial charge from a capacitor coupled to a terminal of a second switching device, with the initial electrical charge, previously stored on the capacitor while the Power unit was not delivering power to the one or more power switching semiconductor devices, delivered to the one or more power switching semiconductor devices through the second switching device when the second switching device is actuated to an ON state in response to commencing of the power delivery for powering the one or more power switching semiconductor devices.

11. The method of claim 10, wherein the optocoupler comprises:
a LED device to emit optical radiation when powered by the power unit; and
at least one photo-sensitive device to generate electrical current when irradiated by at least a portion of the optical radiation emitted by the LED device.

12. The method of claim 11, wherein the first switching device comprises a JFET transistor actuated based on the output of the optocoupler such that the JFET transistor is in an OFF state when the electrical current generated by the optocoupler is applied to a gate of the JFET transistor.

13. The method of claim 10, wherein the one or more power switching semiconductor devices comprise one or more of: a MOSFET transistor, or an Insulated-Gate Bi-Polar Transistor (IGBT).

14. A circuit comprising:
one or more power switching semiconductor devices that receive power delivered by a power unit; and
a high-speed charge control circuit electrically coupled to the one or more power switching semiconductor devices, the high-speed charge control circuit comprising:
an optocoupler to electrically isolate the power unit from the one or more power switching semiconductor devices, the optocoupler coupled to the power unit and further coupled to a first switching device of the high-speed charge control circuit, the first switching device actuated to a conductive state based on output of the optocoupler to establish an electrical path, passing through the first switching device, between at least some terminals of the one or more power switching semiconductor devices and ground to discharge at least a portion of electrical charge present at least on the one or more power switching semiconductor devices through the first switching device actuated to the conductive state by the optocoupler and to the ground when power delivery from the power unit for powering the one or more power switching semiconductor devices is stopped, wherein when the power for powering the one or more power switching semiconductor devices is being delivered from the power unit, the first switching device coupled to the optocoupler is actuated to a non-conductive state such that the electrical path between the at least some terminals of the one or more switching devices and the ground is removed; and a charging circuit to provide an initial electrical charge to the one or more power switching semiconductor devices when the power delivery from the power unit is commenced; and a second switching device actuated to an ON state in response to the power for powering the one or more power switching semiconductor devices being delivered from the power unit; and a capacitor coupled to a terminal of the second switching device with the initial electrical charge, previously stored on the capacitor while the power unit was not delivering power to the one or more power switching semiconductor devices, delivered to the one or more power switching semiconductor devices through the second switching device when the second switching device is actuated to the ON state in response to commencing of the power delivery for powering the one or more power switching semiconductor devices.

15. The circuit of claim 14, wherein the optocoupler comprises:
 a LED device to emit optical radiation when powered by the power unit; and
 at least one photo-sensitive device to generate electrical current when irradiated by at least a portion of the optical radiation emitted by the LED device;
 wherein the optocoupler is further configured to electrically isolate the one or more power switching semiconductor devices from the power unit.

16. The system of claim 9, wherein the hysteresis comparator is configured to:
 cause termination of power to the optocoupler in response to a determination that a comparator voltage level applied at the hysteresis comparator dropped below a predetermined voltage level.

17. The system of claim 1, wherein the optocoupler is actuated based on the power delivered by the power unit.

* * * * *

UNITED STATES PATENT AND TRADEMARK OFFICE
CERTIFICATE OF CORRECTION

| | | |
|---|---|---|
| PATENT NO. | : 9,178,506 B2 | |
| APPLICATION NO. | : 13/623694 | |
| DATED | : November 3, 2015 | |
| INVENTOR(S) | : Edgar Equihua and Sergio Orozco | |

It is certified that error appears in the above-identified patent and that said Letters Patent is hereby corrected as shown below:

In the claims

Column 11, line 32, change claim 7 from:

"7. The system of claim 6, wherein the power unit comprises:
a current boost circuit configured to deliver an initial high current surge to inputs of a transformer to cause a
    charge boost, delivered from the outputs of the transformer, to be provided to the one or more one or more power switching semiconductor devices when power delivery from the power unit is commenced."

to:

-- 7. The system of claim 6, wherein the power unit comprises:
a current boost circuit configured to deliver an initial high current surge to inputs of a transformer to cause a
    charge boost, delivered from the outputs of the transformer, to be provided to the one or more power switching semiconductor devices when power delivery from the power unit is commenced. --

Signed and Sealed this
Fifteenth Day of March, 2016

Michelle K. Lee
*Director of the United States Patent and Trademark Office*